US009768003B2

(12) United States Patent
Deerberg et al.

(10) Patent No.: US 9,768,003 B2
(45) Date of Patent: Sep. 19, 2017

(54) DETECTOR AND SLIT CONFIGURATION IN AN ISOTOPE RATIO MASS SPECTROMETER

(71) Applicant: Thermo Fisher Scientific (Bremen) GmbH, Bremen (DE)

(72) Inventors: Michael Deerberg, Delmenhorst (DE); Michael Krummen, Bad Zwischenahn (DE); Ronald Seedorf, Weyhe (DE); Silke Seedorf, Weyhe (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 15/235,566

(22) Filed: Aug. 12, 2016

(65) Prior Publication Data

US 2017/0047214 A1 Feb. 16, 2017

(30) Foreign Application Priority Data

Aug. 14, 2015 (GB) ................................... 1514536.0

(51) Int. Cl.
*H01J 49/06* (2006.01)
*H01J 37/244* (2006.01)
*H01J 49/02* (2006.01)

(52) U.S. Cl.
CPC .................................. *H01J 49/025* (2013.01)

(58) Field of Classification Search
CPC .......... H01J 49/025; H01J 49/30; H01J 49/06; H01J 49/26; H01J 49/28; H01J 49/0031;
(Continued)

(56) References Cited

U.S. PATENT DOCUMENTS 4,124,801 A * 11/1978 Cook ..................... B01D 59/44 250/281
4,174,479 A * 11/1979 Tuithof ................... H01J 49/30 250/290

(Continued)

FOREIGN PATENT DOCUMENTS

EP 0509887 A1 10/1992
EP 0587448 B1 12/1997

OTHER PUBLICATIONS

Schwieters et al, GB patent application No. 1514471.0, filed Aug. 14, 2015, entitled “Quantitative Measurements of Elemental and Molecular Species Using High Mass Resolution Mass Spectrometry” (specification, claims and drawings).

(Continued)

*Primary Examiner* — David A Vanore
(74) *Attorney, Agent, or Firm* — A.J. Gokcek

(57) ABSTRACT

A method of configuring a Faraday detector in a mass spectrometer is described. The mass spectrometer defines a central ion beam axis, and the Faraday detector is moveable relative to the central ion beam axis. The Faraday detector includes a detector arrangement having a detector surface, and a Faraday slit defining an entrance for ions into the detector arrangement. The Faraday detector has an axis of elongation which extends through the Faraday slit. A width of the Faraday slit is chosen, and the angle between the axis of elongation of the Faraday detector and the central ion beam axis is adjusted such that ions striking the detector surface do not generate secondary electrons.

16 Claims, 11 Drawing Sheets

(58) Field of Classification Search
CPC .......... H01J 49/061; H01J 49/10; H01J 49/16; H01J 49/168; H01J 37/244; H01J 37/304; H01J 37/3171; H01J 27/26; H01J 43/045
USPC ....... 250/281, 283, 298, 299, 282, 296, 397, 250/288, 290, 292, 294, 396 ML, 396 R, 250/423 R, 492.2
See application file for complete search history.

(56) References Cited

U.S. PATENT DOCUMENTS 4,524,275 A * 6/1985 Cottrell .................. H01J 49/30 250/298
4,608,493 A * 8/1986 Hayafuji .............. H01J 37/244 250/396 R
5,194,732 A * 3/1993 Bateman .............. H01J 49/025 250/294
5,376,787 A * 12/1994 Smith .................... H01J 49/06 250/281
5,471,059 A * 11/1995 Freedman ............ H01J 49/025 250/298
6,297,501 B1 * 10/2001 Merren .................. H01J 49/30 250/282
6,452,165 B1 * 9/2002 Schwieters ........... H01J 37/244 250/283
6,723,998 B2 * 4/2004 Bisson .................. H01J 37/244 250/397
6,949,740 B1 9/2005 Sheehan et al.
8,592,757 B2 * 11/2013 Schwieters ........... H01J 49/025 250/281
8,895,915 B2 * 11/2014 Schwieters ........... H01J 49/025 250/281
9,449,791 B2 * 9/2016 Tsukihara ............. H01J 37/304
9,472,389 B2 * 10/2016 Krummen ............... H01J 49/10
2009/0114809 A1 * 5/2009 Hotchkis ................ B01D 59/44 250/282
2012/0211651 A1 * 8/2012 Vogel .................... H01J 49/326 250/296
2013/0103337 A1 * 4/2013 Eiler ..................... G06F 19/703 702/86
2017/0047214 A1 * 2/2017 Deerberg .............. H01J 49/025

OTHER PUBLICATIONS

Weyer et al., "High precision Fe isotope measurements with high mass resolution MC-ICPMS," Int. J. Mass Spec., 226, 355-368, 2003.

* cited by examiner

DETECTOR AND SLIT CONFIGURATION IN AN ISOTOPE RATIO MASS SPECTROMETER

CROSS-REFERENCE TO RELATED APPLICATION

This application claims the priority benefit under 35 U.S.C. §119 to British Patent Application No. 1514536.0, filed on Aug. 14, 2015, the disclosure of which is incorporated herein by reference.

FIELD OF THE INVENTION

This invention relates to the configuration of detectors and slits in a multi-collector isotope ratio mass spectrometer such as a sector field mass spectrometer for high resolution analysis of elemental and molecular species.

BACKGROUND TO THE INVENTION

Quantitative analysis of elemental and molecular species, and often an isotopic ratio of species, is a key interest in many fields of science. For instance, accurate and quantitative determination of elemental and molecular species finds application in environmental, science, material sciences, life science and geology.

A fundamental challenge for accurate and precise quantitative mass spectrometry of molecular and elemental species is the interference between a species of interest and another species having the same nominal mass. One example of a problematic interference is that of isotopologues within a sample having the same nominal mass. For example, in the analysis of methane, 13CH4+, 12CH3D+ and 12CH5+ all have a nominal mass of 17 but an exact mass that differs as a consequence of nuclear mass defect.

In order to permit discrimination between interfering species, e.g. same nominal mass isotopologues, a mass spectrometer having relatively high mass accuracy is necessary. One such device, sold by Thermo Finnigan under the brand name Neptune™, is described in Weyer et al, International Journal of Mass spectroscopy, 226, (2003) p 355-368. The Neptune™ device is a double focusing multiple collector inductively coupled plasma (MC-ICP) mass spectrometer and may be used to determine isotopic fractions of atomic and polyatomic ions. The detector chamber of the mass spectrometer is equipped with a plurality of Faraday collectors. Ions are spatially separated by the mass analyzer in accordance with their mass to charge ratio. Each Faraday collector is precisely aligned with respect to atomic and polyatomic ions of a particular nominal mass. The Faraday collectors are each provided with an entrance slit. In use, the parameters of the mass analyzer are adjusted so that ions of different masses are scanned across the slit. With suitably high resolution, ion species of the same nominal mass but different true masses can be separately detected.

Our co-pending application no. GB1514471.0, filed on even date, describes a double focusing gas isotope ratio mass spectrometer (GIRMS) developed by Thermo Fisher Scientific under the name 253 Ultra™. The device has a multiple collector positioned at the focal plane of a double focusing magnetic sector mass analyser. High, medium and low resolution can be selected automatically using a switchable spectrometer entrance slit. The device is capable of resolutions up to several tens of thousand.

The multiple collector comprises a fixed axial collector which is a dual mode detector having a Faraday cup and a high sensitivity ion counting detector (SEM). The multiple collector also carries 8 moveable detector platforms mounted as 4 platforms on each side of that fixed axial collector. Each moveable detector platform is equipped with a Faraday detector and can also carry a compact discrete dynode (CDD) ion counting detector. In total, the multiple collector can thus carry 9 Faraday detectors (the axial detector plus 8 more, located 4 each side of the axis) and 8 CODs (again, 4 each side of the axial Faraday detector).

FIG. 1 shows an ideal high resolution scan across the slit of a Faraday collector in a double focusing gas isotope ratio mass spectrometer such as the 253 Ultra™ described above. The presence of "steps" at the shoulders of the main peak is analytically interesting since it may permit identification of different isotopologues or other distinct species.

FIG. 2 shows a scan across a Faraday detector slit with a first signal artefact that can sometimes be observed, when the mass spectrometer is operated at high resolutions up to, for example, 40,000. The artefact is labelled 1 in the figure. As may be seen, the artefact is proximal to the shoulder of the peak, where analytically interesting information may be present. Thus the presence of the artefact 1 in FIG. 2 is undesirable.

FIG. 3 shows a high resolution scan across a Faraday detector slit having a second signal artefact, labelled 2 in the figure, which can also sometimes be observed. Again, artefact 2 is found at the end/shoulder of the main peak, and its presence can reduce or completely mask the ability to detect any analytically significant peak information that would otherwise be seen at the peak shoulders.

The present invention seeks to identify and address problems with Isotope Ratio mass spectrometers such as the GIRMS and MC-ICP MS, that result in the various unwanted artefacts described above.

SUMMARY OF THE INVENTION

The inventors have identified various difficulties arising from the multiple collector arrangement described above.

FIG. 4 shows, schematically, a part of a multiple collector 100 for a dual sector mass spectrometer, together with an ion beam 110. As explained above, the multiple collector 100 comprises a fixed axial collector 120 along with a plurality of moveable collectors (130). In FIG. 4, only some of the moveable collectors (130*a*, 130*b*, 130*c*, 130*e*, 130*f*) are shown, and for clarity the CDDs have been omitted. As may be seen in FIG. 4, the fixed axial collector 120 is positioned upon a central axis I of the ion beam 110, and a focal plane P extends about the central axis I of the ion beam, at an angle of around 45 degrees thereto. The moveable collectors 130 (along with the fixed axial collector 120) are laterally spaced along the focal plane P and each of the moveable collectors 130 are moveable along the focal plane. At least some, optionally all, of the moveable collectors can be mounted on a respective motorized platform. Any moveable collectors that are not mounted on a motorized platform can be moved position by being pushed or pulled by one or more moveable collectors that are mounted on a motorized platform. Typically, every other collector 130 is mounted on a motorized platform.

The ion trajectories of spatially separated ion species in the beam are not, typically, parallel at the focal plane P. As may be seen in the Figure, separated ions of different ion species (eg different isotopologues) arrive at the focal plane P travelling in different, non-parallel directions. In general terms, the angle between the direction of travel of ions and the central axis I of the ion beam gradually increases with distance away from that central axis I. It is thus desirable to mount the longitudinal axes of the plurality of moveable collectors 130 at different angles relative to the central axis I of the ion beam (or, equivalently, at different angles relative to the focal plane P), in order to reduce the difference in angle between the various incident ion species and the respective longitudinal axes of the Faraday detectors. For example, the longitudinal axis A1 of the Faraday detector of a relatively outwardly mounted moveable collector (eg, the moveable collector 130*f*) may be aligned at a first angle $\alpha 1$ relative to the central ion beam axis I. The longitudinal axis A2 of the Faraday detector of a relatively inwardly mounted moveable collector (eg, the moveable collector 130*e*) may be aligned at a second angle $\alpha 2$ relative to the central ion beam axis I. Because of the non-parallel ion beam, it is desirable that $\alpha 1 > \alpha 2$.

Each of the finite number of moveable collectors is intended to detect ions across a range of mass to charge ratios. The range of mass to charge ratios that each moveable collector may detect can overlap with the range to be detected by adjacent detectors, but in general terms, each moveable collector 130 is intended to detect ions within a predetermined range of mass to charge ratios, which corresponds with a particular range of incident ion angles (relative to the central ion beam axis I). Each particular ion species will arrive at the focal plane P having its own specific angle of incidence relative to the central axis of the ion beam. Hence, a set of compromise angles is chosen, one for each of the plurality of moveable collectors 130. The compromise angle that is chosen to mount each moveable collector 130, lies somewhere between the largest and smallest angles of incidence of ions for that moveable collector 130.

Selecting a compromise angle for each of the moveable detector platforms relative to the central beam axis I presents no difficulties in respect of the CDD detectors, because the first dynode of each such CDD lies immediately behind the entrance slit thereof, so that there is a good tolerance to variations in the angle of arrival of incident ions relative to each CDD. However, for the Faraday detectors, it has been found that a much lower range of angles of incidence of ions at the Faraday detectors is acceptable. The apparent reason for this may be understood with reference to FIG. 5.

The Faraday detectors 140*a*-140*h* of the fixed and moveable collectors are of similar construction, and one of them is shown in schematic view in FIG. 5. The Faraday detector comprises a cup 200 which is elongate in a direction A. The Faraday detector 140 is, in the embodiment of FIG. 5, mounted at an angle $\alpha$ defined as the angle between that longitudinal axis A of the Faraday detector 140 and the central ion beam axis I.

The cup 200 is provided with a Faraday slit 210 at a first, opening end 220 of the cup 200 facing the incident ion beam. Inside the cup 200 is a graphite insert 230. In use, ions enter the cup 200 through the Faraday slit 210 and strike the graphite insert 230 resulting in the generation of secondary electrons. The secondary electrons are captured and counted, as will be familiar to those skilled in the art.

The graphite insert 230 for the Faraday detector 140 is positioned at the inner walls and towards a bottom end 240 of the cup. The Faraday detector 140 also comprises a secondary ion repeller plate 250, mounted between the graphite insert 230 and the Faraday slit 210.

It has been found that the angle, $\gamma$, between the direction of travel, B, of ions arriving at a particular one of the Faraday detectors, and the longitudinal axis A of that particular Faraday detector 140, is important for high resolution analysis. In particular, it is desirable that this "off axis" angle $\gamma$ is relatively small, so that the ion beam 110 passes through the Faraday slit 210 into the cup 200, and strikes the graphite insert 230 towards the bottom end 240 of the cup. If the ion beam 110 enters the Faraday detector 140 via the Faraday slit 210 at a relatively larger off axis $\gamma$, however, the ion beam strikes the side wall of the Faraday detector away from the bottom end 240 of the cup, as shown in FIG. 5. This results in the generation of secondary electrons (labelled e− in FIG. 5) closer to the Faraday slit 210. If the secondary electrons are generated too close to the opening end 220 of the cup 200, they may leave the Faraday detector 140 via the Faraday slit 210, because their energy at the secondary ion repeller plate 250 may be greater than the potential of that secondary ion repeller plate 250. It is believed that the artefact 1 in FIG. 2 is a consequence of lost secondary electrons resulting from this off axis incidence of ions at the Faraday detector 140.

To address this, in accordance with a first aspect of the present invention, there is provided a method of configuring a Faraday detector in a multiple collector of a mass spectrometer, as defined in claim 1. The invention also extends to a multiple collector being under the control of a controller configured with a computer program which, when executed, carries out that method, so as to configure the/or each Faraday detector.

Aspects of this invention thus provide for an arrangement in which the peak in the Faraday detector(s) has a flat top, that is, the artefact resulting from lost charges is not present. This is achieved by, for example, selecting the Faraday collector angle ($\alpha$)—for example, iteratively—and/or reducing the Faraday slit width, for a given spectrometer entrance slit width, to a size where the artefact-causing effect is removed, while still retaining an optimum ion transmission into the Faraday detector(s). Preferably, where a single Faraday collector angle ($\alpha$) is adjusted or set for a respective Faraday detector, the Faraday collector angle ($\alpha$) is so adjusted or set that ions entering the detector arrangement strike the detector surface at a location which prevents secondary electrons generated thereby from exiting the Faraday detector via the Faraday slit no matter where along the focal plane the Faraday detector is positioned (a "compromise" angle).

In a preferred embodiment, a compromise angle between the longitudinal axis of each of a plurality of Faraday detectors, and the central ion beam axis at each of the respective plurality of Faraday detectors, may be identified, for example iteratively, such that the artefact 1 is removed for all of the Faraday detectors, no matter where along the focal plane each detector is placed. Because of the divergence of the ion beam at the focal plane, each Faraday detector may have its own respective (fixed) compromise angle different from the compromise angle of the other Faraday detectors. For example, the compromise angle of a first Faraday detector relatively closer to the central fixed axial collector may be smaller than the compromise angle of a second Faraday detector relatively more distant from that fixed axial collector, in a direction transverse to the ion beam travel direction.

In the case that a compromise angle can be identified, and which is suitable to avoid the problems of lost charges right across the allowed range of movement of a particular one of the Faraday collectors, then this may be determined during initial setup of the instrument. Then, the Faraday collector orientation relative to the focal plane P (or, equally, relative to the central axis I of the ion beam, upon which the fixed axial collector is mounted)—that is, a determined compromise angle that addresses charge loss across the range of movement of the Faraday collector—can be fixed during instrument calibration. Having a fixed compromise angle for a given Faraday detector simplifies the mechanical support required by the moveable collector upon which it is mounted, since the Faraday detector is then only required to be moveable in a direction generally parallel with the focal plane P. It may be that no solution is identifiable to provide a (fixed) compromise angle for one, some or even all of the Faraday detectors, which results in the removal of the artefact from the or each of the detectors, across the full range of movement of the or each particular Faraday detector. In that case, the angle of one, some or all of the Faraday detectors relative to that of the fixed axial collector (or equally relative to the focal plane or central beam axis, I) may be adjustable. In other words, the angle of at least one, optionally all, of the Faraday detectors can be mechanically changed with its position along the focal plane. For example, one or more of the Faraday detectors may be pivotally mounted upon a rail or support that extends in a first direction substantially parallel to the focal plane. Then, the Faraday detector may be moved closer to, or further away from, the central axis I of the ion beam, along that first direction. Pivotal mounting of the (or each) Faraday detector also then allows rotation of the Faraday detector about an axis perpendicular to the first direction. This permits the angle of the longitudinal axis of the Faraday detector relative to the focal plane, and thus relative to the central beam axis I, to be adjusted. In that case, a controller may be configured to control both the movement of the moveable collector (which includes the Faraday detector) along the first direction, while simultaneously controlling the direction (that is, the angle) of the longitudinal axis of the Faraday detector relative to the focal plane and the central beam axis I. Put another way, the controller controls both the movement of the Faraday detector along a line, as well as rotation about an axis perpendicular to that line so that, as the spacing of the Faraday detector relative to the central fixed axial collector changes, the angle of the longitudinal axis of the Faraday detector relative to that fixed axial collector changes. Thus, as the Faraday detector moves along the focal plane (to allow it to detect ions of different mass to charge ratios), the longitudinal axis of the Faraday detector may be maintained more or less parallel with the incident ions of that mass to charge ratio. In this manner, the problems of lost charges are ameliorated or resolved.

Instead of a single pivotal mounting of a Faraday detector relative to a single rail or the like (where the rail preferably extends in a direction substantially parallel to the focal plane), the, or each, Faraday detector could instead be journalled upon first and second spaced non-parallel rails. Then, as the Faraday detector moves along the rails, the changing separation between the rails will result in a change in angle of the longitudinal axis of the Faraday detector relative to the focal plane and the central beam axis I. In one embodiment, the first and second supporting rails may each be linear, so that the rate of change of the spacing between them is constant. This results in a constant rate of change of angle of the longitudinal axis of each Faraday detector, as a function of position of the Faraday detector relative to the central ion beam axis I. Alternatively, one or both of the support rails may be curved so that there is a non-linear (non-constant) change in the angle of the longitudinal axis relative to the separation between the Faraday detector and the central ion beam axis I. Still further, parts of the first and second rail supports may be parallel with each other, while other parts of the rails are non-parallel, eg, curved. This allows a constant angle of the longitudinal axis relative to the focal plane P to be maintained over a first part of the movement of the Faraday detector along the first direction, while, over a second part of the movement of the Faraday detector along that first direction, the relative angle between the focal plane P and the longitudinal axis of the Faraday detector may change, eg under computer control.

Thus it will be understood that it is possible to combine the two concepts of a fixed compromise angle for the Faraday detectors, and a variable angle for the Faraday detectors. Depending upon the amount of the ion beam spread, for example, it may be necessary or desirable that only some of the moveable Faraday detectors have a variable angle relative to the focal plane of the ion beam or the central beam axis I. In particular, relatively outwardly located Faraday detector(s) (eg, the detector in the moveable collector **130*f*) may be mounted upon a curved or otherwise non-linear support/rail, while relatively inwardly positioned Faraday detector(s) (eg the detector in the moveable collector 130*e***) may be positioned at a fixed angle with respect to the central fixed axial collector.

For example, a multiple collector may comprise N Faraday detectors (N may be 9, for example) of the N Faraday detectors, a central Faraday detector might be fixed in a position defining a transverse axis, and having a detector body that is presented at a first angle relative to the focal plane of the incident ion beam. A first group of M Faraday detectors of the N in total ($M<N$) may be positioned laterally of the central Faraday detector, and may be relatively moveable along the focal plane of the incident ion beam so as to adjust the separation, along that focal plane, between them or at least two of the, M Faraday detectors, but where however the angle between each of the M Faraday detectors remains fixed, preferably at a respective previously identified compromise angle.

A second group P of Faraday detectors, however (P is also $<N$, and, preferably, $P+M+1=N$) may also be relatively moveable with respect to the central fixed Faraday detector/the focal plane, but may have a variable angle relative to the focal plane as they move laterally. Those P Faraday detectors, for example, may even have a fixed angle relative to the focal plane over a first range of movement in the transverse direction, while having a variable angle relative to the focal plane over a second range of movement in the lateral direction. Generally each of M and P can be a number from 0 to $N-1$, provided $P+M+1=N$)

A multiple collector for an Isotope Ratio mass spectrometer in accordance with claim 10 is also provided.

A further problem that has been identified by the inventors is sometimes observed when carrying out higher resolution scans. It is thought that the artefact 2 shown in FIG. 3, at the edges of the peak, is the result of an electron cloud which is formed when the ions strike the edges of the Faraday slit. This electron cloud pulls down the intensity vs mass scan. In lower resolution scans, although the ions incident at the slit entrance may create an electron cloud, any negative effects of such an electron cloud on the detector output tend not to be observable because the edges of the peak tend to rise and fall relatively slowly. However in higher resolution scans, particularly those in the Ultra-253 instrument where resolution may be up to 40,000, the peak edges tend to be steeper, so that the effect of the electron cloud can then become apparent.

In order to address the second problem, a multiple collector for an isotope ratio mass spectrometer is provided, in accordance with claim 13. Using such a slit shape in the multiple collector suppresses the secondary electron cloud at the slit edges and thus removes the negative dips at the shoulders of the scan. The use of this slit shape is applicable both to Faraday detectors and also to CDDs within the multiple collector; in particular it has been found that the electron cloud generated adjacent to a slit with parallel sides is present in both such types of detector. Using the modified slit shape of aspects of this invention is thus of benefit in removing artefacts arising in the outputs of both the Faraday detector(s) and the CDDs.

The invention also extends to an isotope ratio mass spectrometer, such as a double focusing MC-ICP-MS, a double focusing gas isotope ratio MS or the like, the isotope ratio mass spectrometer comprising an ion source, a magnetic and, optionally an electric sector for selection of ions of species of interest, and a multiple collector as defined above.

BRIEF DESCRIPTION OF THE DRAWINGS

The invention may be put into practice in a number of ways and some specific embodiments will now be described by way of example only and with reference to the accompanying drawings in which.

DETAILED DESCRIPTION OF PREFERRED EMBODIMENTS

Figure 6:
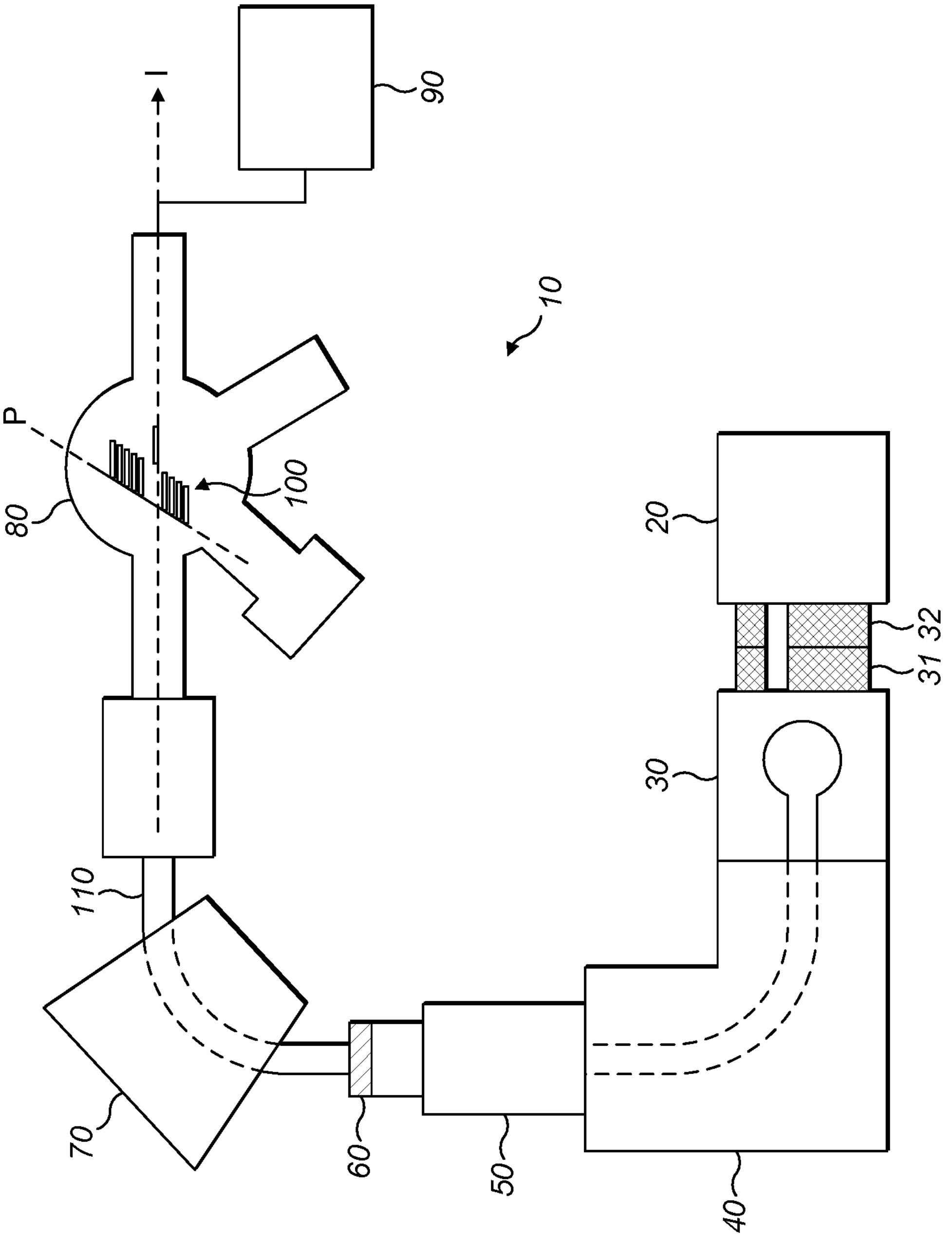
FIG. 6 shows a schematic plan view of a double focusing gas isotope ratio mass spectrometer having a multiple collector including a fixed collector mounted on a central beam axis, and moveable collectors, each of which comprises a Faraday detector, mounted around the central beam axis.

Referring first to FIG. 6, there is shown a schematic representation of a double focusing gas isotope ratio mass spectrometer 10. Ions are generated at the ion source 20 which is powered by power supply 30 connected via connectors 31, 32. Via one or more ion optical devices (not shown), the ions are accelerated and passed through an electrostatic analyzer (ESA) 40 which assists in focusing the ion beam and selecting ions of the required energy. The ions next enter a focusing quadrupole 50 to further focus the ion beam. On exiting the focusing quadrupole, the ion beam passes through an exit aperture defined in a mask 60, and then onwards through a magnetic field applied at an electromagnetic sector 70.

The exit aperture at mask 60 has different possible widths which determine the resolution of the ion beam. As the aperture allows only a portion of the focused ion beam to pass, selection of an aperture having a larger area or wider slit allows a greater portion of the ion beam (in other words, a larger number of ions) to pass through into the magnetic field, and so provides a more sensitive measurement. However, a small area or narrower aperture can be useful to reduce ion optical aberrations, thereby delivering improved resolution for the measurement, albeit at the expense of some sensitivity.

Figure 4:
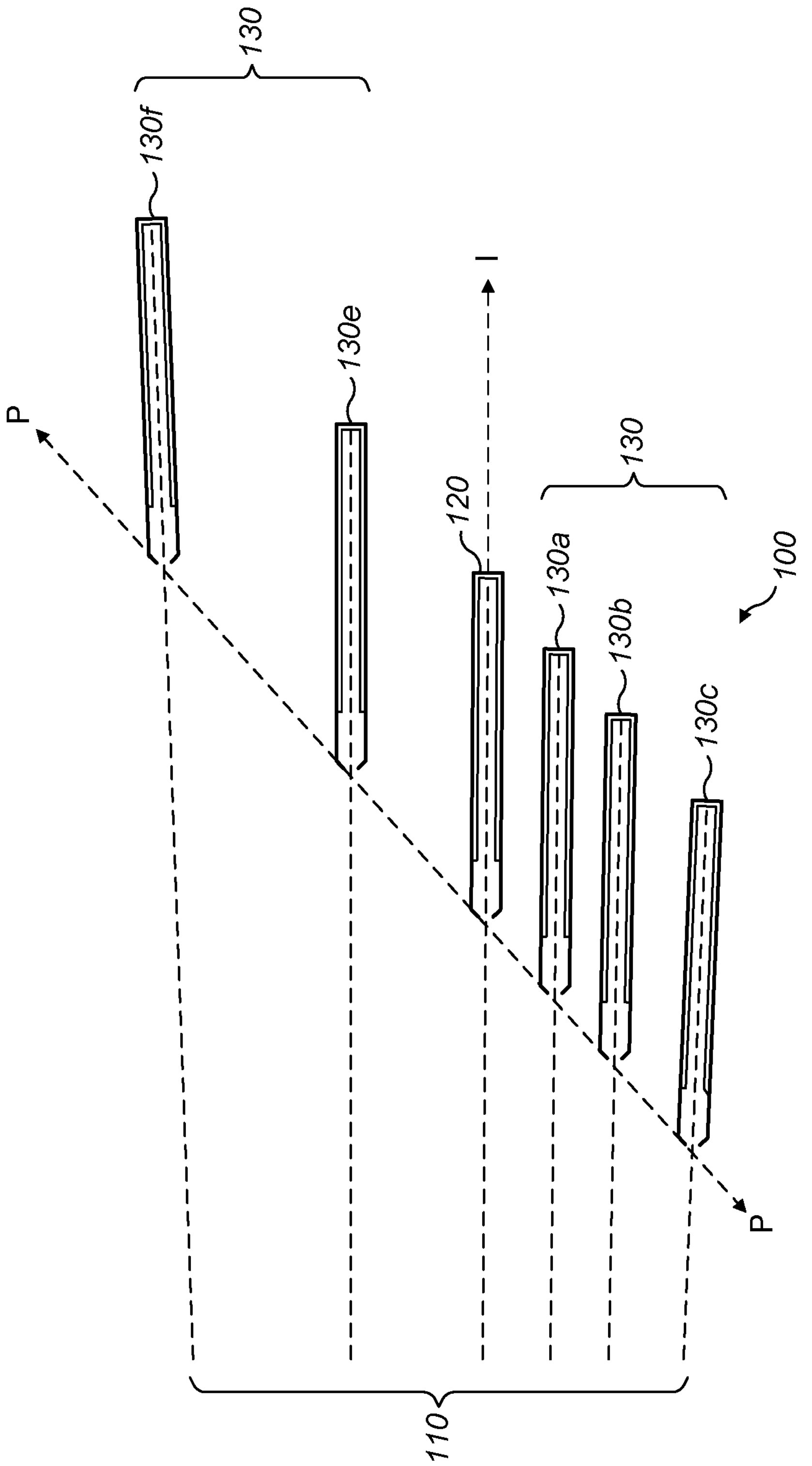
FIG. 4 shows, schematically, a part of a multiple collector for a dual sector mass spectrometer, including a plurality of Faraday detectors.

Within the magnetic mass analyzer at the electromagnetic sector 70, the applied magnetic field causes a change of direction or a deflection of the ions. Ions of greater mass are deflected less than ions with smaller mass, causing a spatial separation of the ions according to their mass-to-charge ratios. The separated ions exit the magnetic mass analyzer 70 and pass into the detector chamber 80. A multiple collector 100 including a plurality of Faraday detectors and conventional differential detectors (CCD) are arranged within the detector chamber 80. The general arrangement of the detectors is as described above in connection with FIG. 4 in particular, in that there is a fixed axial collector 120 having a Faraday detector, together with 8 further moveable collectors (mounted 4 each side of the fixed axial collector), each of which moveable collector may be provided with a Faraday detector and a CDD (not shown in FIG. 6).

The Faraday detectors 140 are arranged along the focal plane P of the ion beam in order to receive each species of spatially separated ions simultaneously. The operation of the mass spectrometer 10 and the collection of data may be controlled by a computer 90 having a control module and analysis module.

Figure 7:
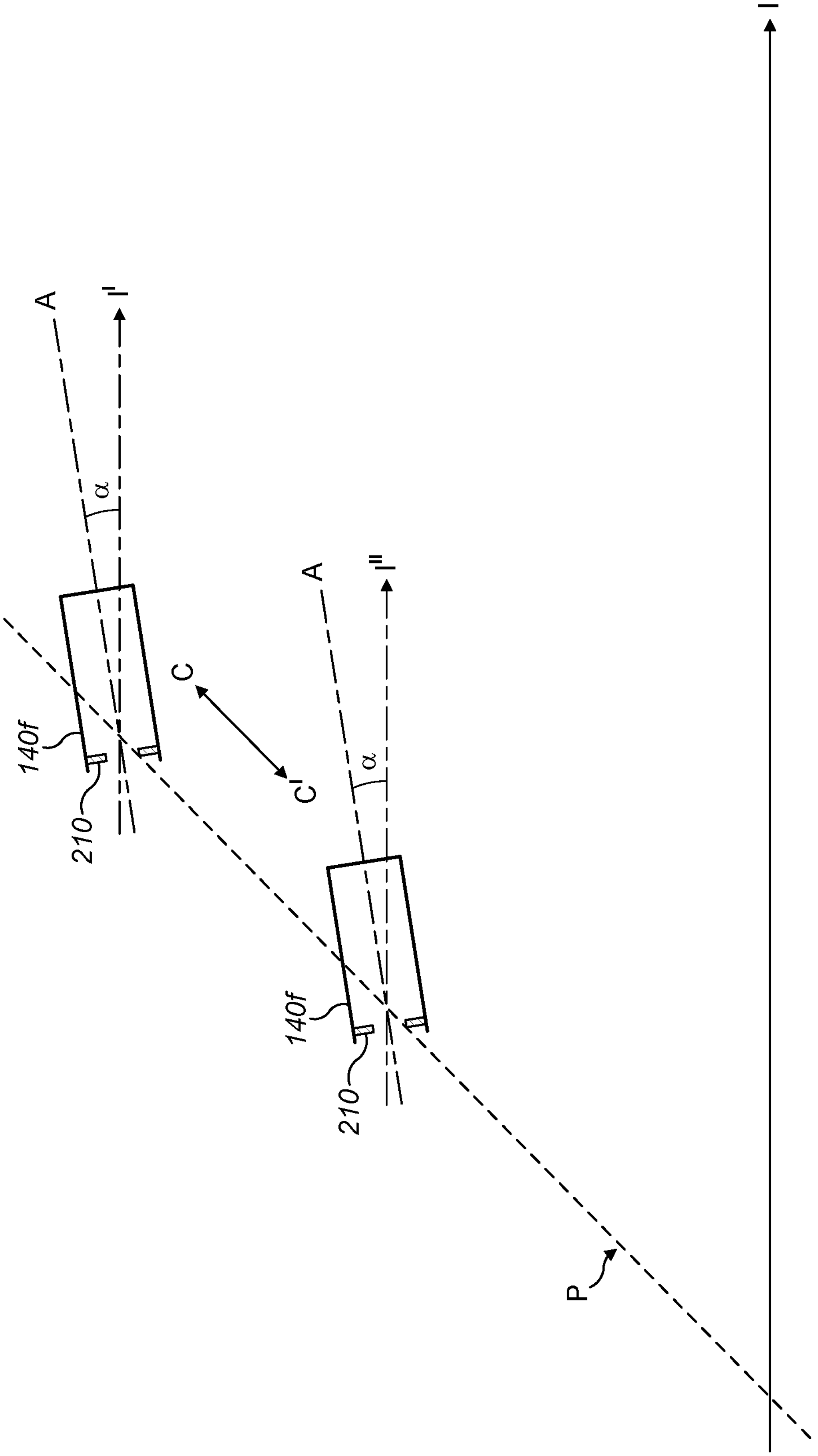
FIG. 7 shows a schematic plan view of one of the moveable collectors of FIG. 6, in two positions each at a common angle relative to the central beam axis.

FIG. 7 shows a highly schematic, simplified plan view of one of the moveable Faraday detectors 140*f* within the detector chamber 80, in first and second positions. No particular significance is to be attached to the identity of the particular Faraday detector chosen for description here; the invention in several of its preferred embodiments is equally applicable to any of the moveable Faraday detectors, and indeed may be applicable in part to the fixed axial detector as well, as will become apparent from the description that follows. It is also to be appreciated that FIG. 7 is not drawn to scale; indeed, some dimensions have been exaggerated for a better understanding of the principles involved.

Figure 5:
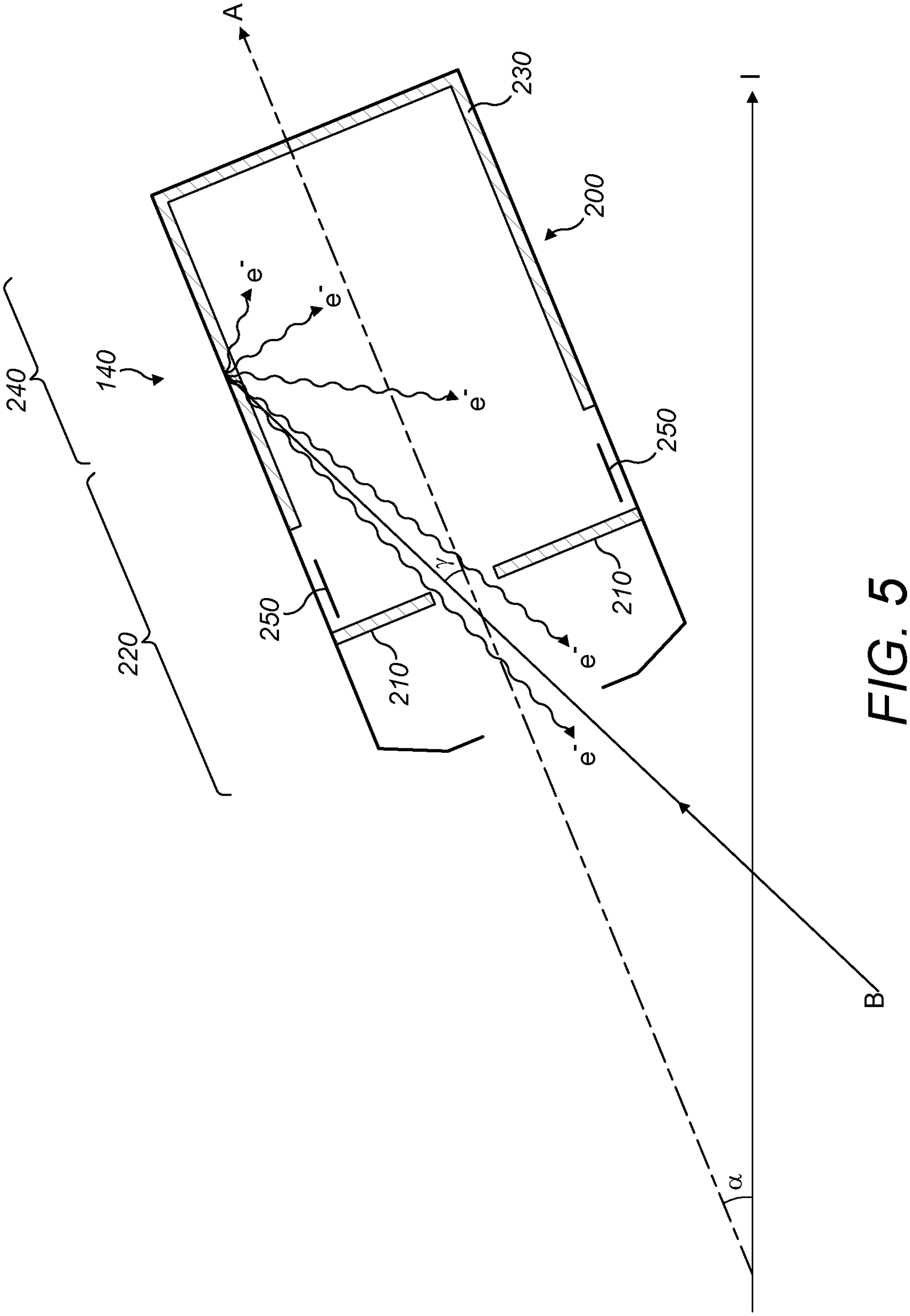
FIG. 5 shows, schematically, a section through one of the Faraday detectors of FIG. 4.

The Faraday detector 140*f* itself is constructed in the manner described above in connection with FIG. 5, and so the details of it (cup, graphite insert, Faraday slit etc) will not be repeated here for brevity.

In the arrangement of FIG. 7, the longitudinal axis A of the moveable Faraday detector 140*f* is mounted at a fixed angle $\alpha$ relative to the central ion beam axis. Axes parallel to the central ion beam axis I and intersecting the longitudinal axis A of the moveable Faraday detector are marked in FIG. 7, as I' and I" for the two positions of Faraday detector shown.

The Faraday detector 140*f* shown in FIG. 7 is capable of movement along the axis C-C' which extends parallel with the focal plane P, that is, the axis of movement of the Faraday detector **140*f* is preferably at or around 45 degrees to the central ion beam axis I. The Faraday detector 140*f* may be moved using a driver motor or the like (not shown), along a rail or other linear support which extends along the direction C-C' (also not shown in FIG. 7). In this manner, the Faraday detector may be positioned at a plurality of positions, only two of which are shown in FIG. 7, so as to align with ions arriving from the electromagnetic sector device 70 at different positions along the focal plane P in accordance with their mass to charge ratio. Manual or mechanical movement of the Faraday detector 140*f*** is of course possible as well or instead.

The ion beam 110 is not parallel at the focal plane, but rather at least somewhat fan shaped so that ions of different mass to charge ratios diverge from one another at that focal plane P. The angle α of the Faraday detector is, on the other hand, fixed. This means that, at the opening in the Faraday slit 210 of the Faraday detector **140*f*, the "off axis angle" between the incident ions and the longitudinal axis of the Faraday detector 140*f* differs between the two positions of the Faraday detector shown in FIG. 7**. In general terms, because of the fan shaped ion beam, the off axis angle reduces as the Faraday detector moves towards the central ion beam axis I, and increases as it moves away from it.

The Faraday detector **140*f* has a limited range of movement along the axis C-C'. The full range of angles/positions along the focal plane at which the multiple collector 100 of FIG. 6 can detect incident ions is defined by the maximum separation between the outermost moveable collectors (130*f* and 130*h*). Angles and positions between those two extremities are detected using those detectors, one or other of the inwardly positioned moveable detectors 130*a, b, c, e, f, g*, or the fixed axial collector 120. The angle α, or a derivative of it (for example, an angle measured relative to the focal plane), is chosen so as to avoid incident ions from striking the inner side walls of the Faraday detector 140*f* and generating electrons too close to the Faraday slit 210 so that they are lost rather than captured within the Faraday detector. In particular, in accordance with one aspect of this invention, across the range of movement of a given one of the Faraday collectors 140, the ion beam enters the Faraday collector at an angle α sufficiently acute that substantially all of the secondary electrons created are captured and detected/counted, rather than being lost from the Faraday detector via the Faraday slit 210**.

The width of the Faraday slit 210 is preferably reduced to the minimum width that still provides a flat top peak shape for the ions even for the lowest spectrometer resolution setting (using the widest available spectrometer entrance aperture defined in the mask 60). In the arrangement shown in FIG. 6, the width of the entrance aperture in the mask 60 (and the magnification of the ion optics) determines the width of the Faraday slit 210. In accordance with embodiments of the invention, therefore, an initial setup procedure may be carried out. The procedure may be carried out either during construction or installation of the mass spectrometer, with the various selected parameters then fixed during subsequent use, or the computer 90 of the mass spectrometer 10 may be programmed to run a setup routine during each startup of the instrument, or may even be programmed to run a calibration at regular or specified intervals during use.

Setup proceeds as follows. Once the beam line has been correctly aligned with the multiple collector 100 and the fixed axial collector 120, a Faraday slit width is chosen for a particular one of the Faraday detectors 140. Choice of the slit width will depend, for example, on the intended use of the particular instrument being configured. For example, the slit width which is optimal or appropriate for detection of high mass ion species (say, Caesium to Uranium ions), may be different to the slit width that is appropriate for carbon based simple molecules (CHx, CO, CO2 etc).

Figure 2:
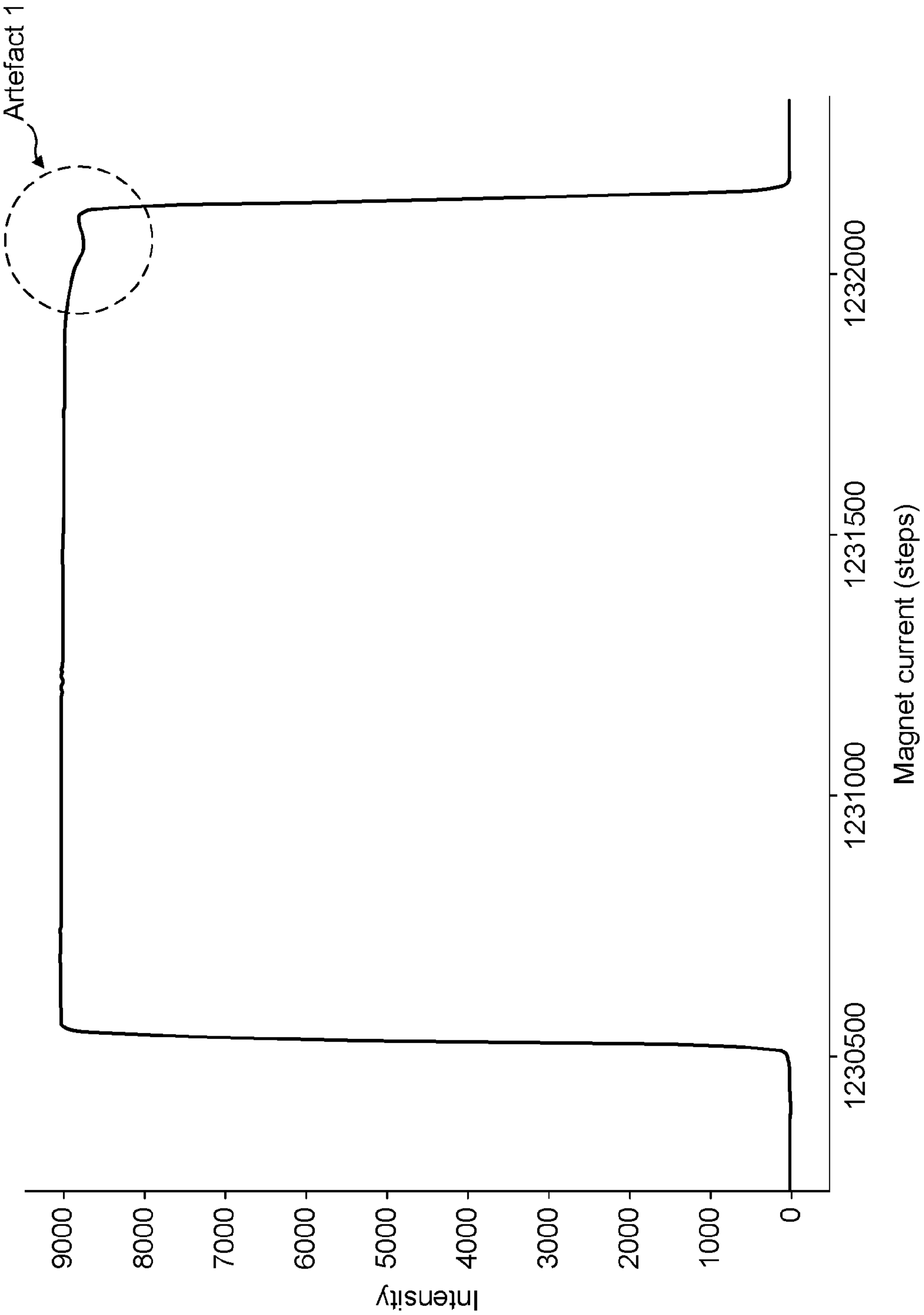
FIG. 2 shows a high resolution scan across a Faraday detector slit of a isotope ratio mass spectrometer having a first signal artefact.

Next, angles for each of the plurality of moveable collectors, and in particular for each of the Faraday detectors 40, are identified. Identification of a suitable angle for each Faraday detector 140 proceeds on the basis of finding a solution to the problem of avoiding the artefact 1 shown in FIG. 2—that is, finding an angle for each Faraday detector 140, at which ions are captured deep inside that Faraday detector so that no secondary electrons can escape—for all possible positions along the focal plane P for a particular detector. The angle thus identified is henceforth referred to as the "compromise angle".

The geometry and dimensions of the components relevant to this solution are such that theoretical calculation of a suitable angle is impractical. Moreover, the mass spectrometer has a wide range of potential applications, and different applications will require accurate/high resolution detection of particular, different ion species. Each species will arrive at different positions/angles to the focal plane P of the ion beam, so it is not sufficient simply to choose a single, generic Faraday detector angle if the artefact caused by secondary electron loss is to be avoided.

Instead, the (or at least, a) solution to the problem is determined empirically. A starting point for iterative analysis may be used, based upon previously identified suitable angles for the particular instrument application intended. Iterative identification of the optimum compromise angles may be achieved by using one or more test samples that produce ions of known mass to charge ratios, and in particular ion species similar or identical to those that the instrument is intended to analyse when commissioned into use.

Figure 1:
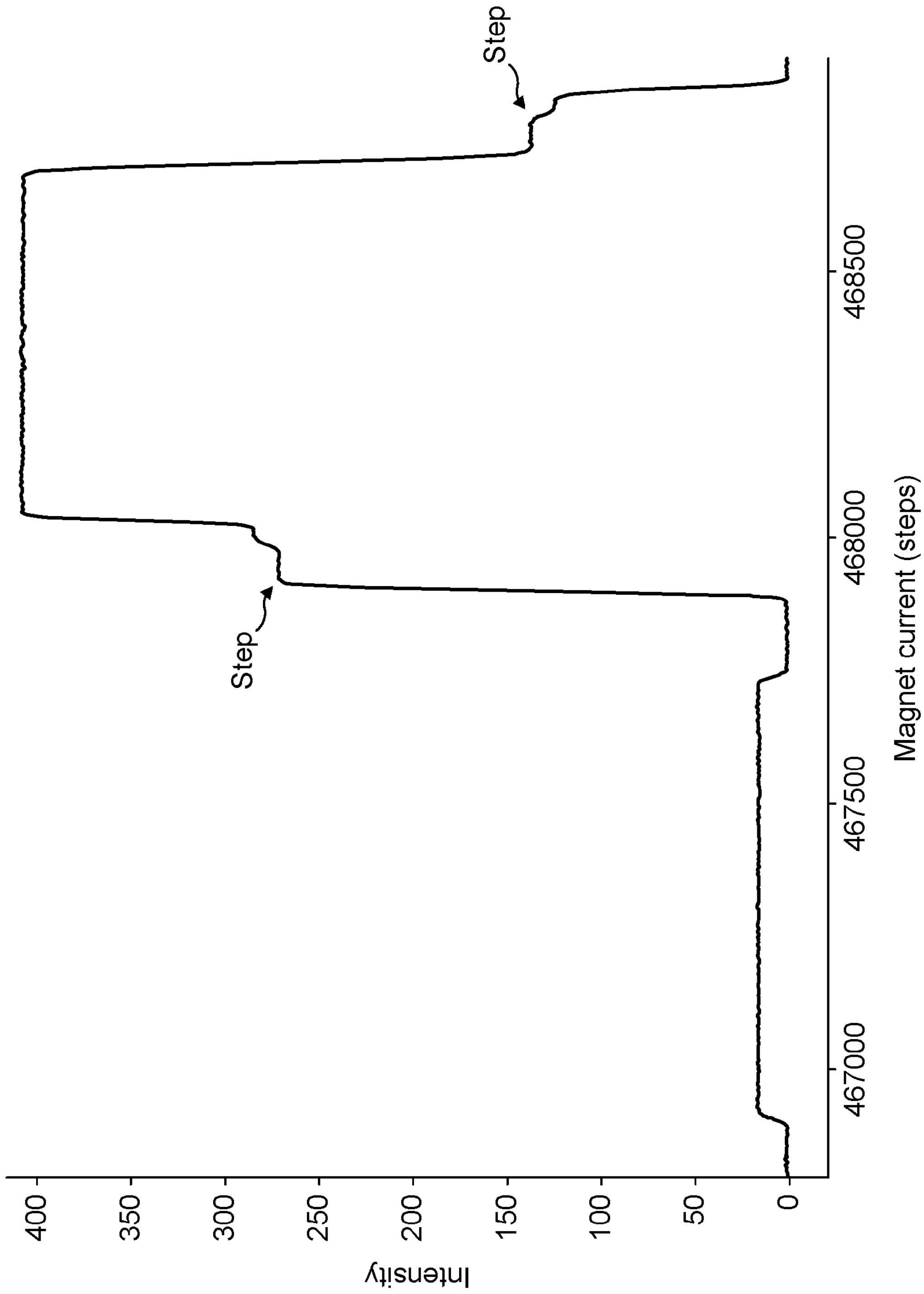
FIG. 1 shows an ideal high resolution scan across the slit of a Faraday collector in an isotope ratio mass spectrometer.

The ions generated by a test sample or samples are scanned across the Faraday slits of the respective appropriate ones of the Faraday detectors 140. The resulting scans (eg of FIGS. 1 and 2) are studied, either by a user or through software analysis, to look for artefacts such as artefact 1 shown in FIG. 2. If the artefact is present in a scan from a particular Faraday detector, the angle of the longitudinal axis thereof is adjusted relative to the central ion beam axis I to provide a different angle, at which, ideally, the artefact is not present. The process is then repeated for other positions of each Faraday detector 140 across its range of movement until either the artefact 1 is removed for all such positions, or is minimized.

In practice it may be possible simply to select a first trial angle for the moveable collector relative to the central ion beam axis I, move the moveable collector to one extreme of its range of travel along the focal plane P, carry out the scan described above, and then repeat at the other extreme of the range of travel along the focal plane P. If the artefact 1 is observed in either of the two scans thus carried out, then a new angle for the moveable collector relative to the central ion beam axis I is chosen and the steps above are repeated. The iterations repeat until an angle is found at which the artefacts are not visible in the scan at either end of the range of movement of the particular moveable collector being set up. The reason why it may only be necessary to carry out scans at the extremes of the range of movement of each moveable collector is because of the divergent shape of the ion beam. If the chosen angle for the moveable member solves the problem of secondary electron loss at each extreme, then it must solve the problem at all positions between those extremes.

The (or an) angle of the longitudinal axis of each Faraday detector relative to the central ion beam axis I/the longitudinal axis of the fixed axial collector 120, at which the artefact 1 is removed or its presence is minimized, at both ends of the range of travel of a particular moveable collector, is then selected as the compromise angle for that moveable collector. Depending upon various factors, there may be either a relatively narrow or a relatively wide range of angles that solve the problem of secondary electron loss and which could, therefore, be employed as the compromise angle.

Because of the divergence of ions across the ion beam, a compromise angle identified for a first of the detectors, adjacent to the fixed axial detector 120, (eg the Faraday detector 140*a*) may not be suitable for detectors further away from the fixed axial detector 120 (eg the Faraday detector 140*d*). Therefore, the iterative procedure for empirical determination of a suitable compromise angle may be carried out separately in respect of some or all of the moveable collectors 130.

The iterative procedure described above selects but then fixes the angle of the longitudinal axis of each Faraday detector 140 relative to the central ion beam axis I. In other words, once a compromise angle is identified or chosen for a given Faraday detector 140, that compromise angle is then retained and maintained constant unless and until it is decided to recalibrate the mass spectrometer. The benefit of this is that the arrangement by which each Faraday detector 140 is mounted for movement in the direction C-C' (FIG. 7) along the rail or support may be relatively simple, reducing cost and complexity.

As an alternative, however, and as will now be described by reference to FIGS. 8, 9 and 10, one, some or all of the Faraday detectors 140 may be mounted so as to be both moveable in a first direction (generally, a direction parallel with the focal plane P of the incident ion beam) and also rotatable about a second axis orthogonal thereto, in order to permit the longitudinal axis of each Faraday detector 140 to present a range of angles relative to the central ion beam axis I.

Figure 8:
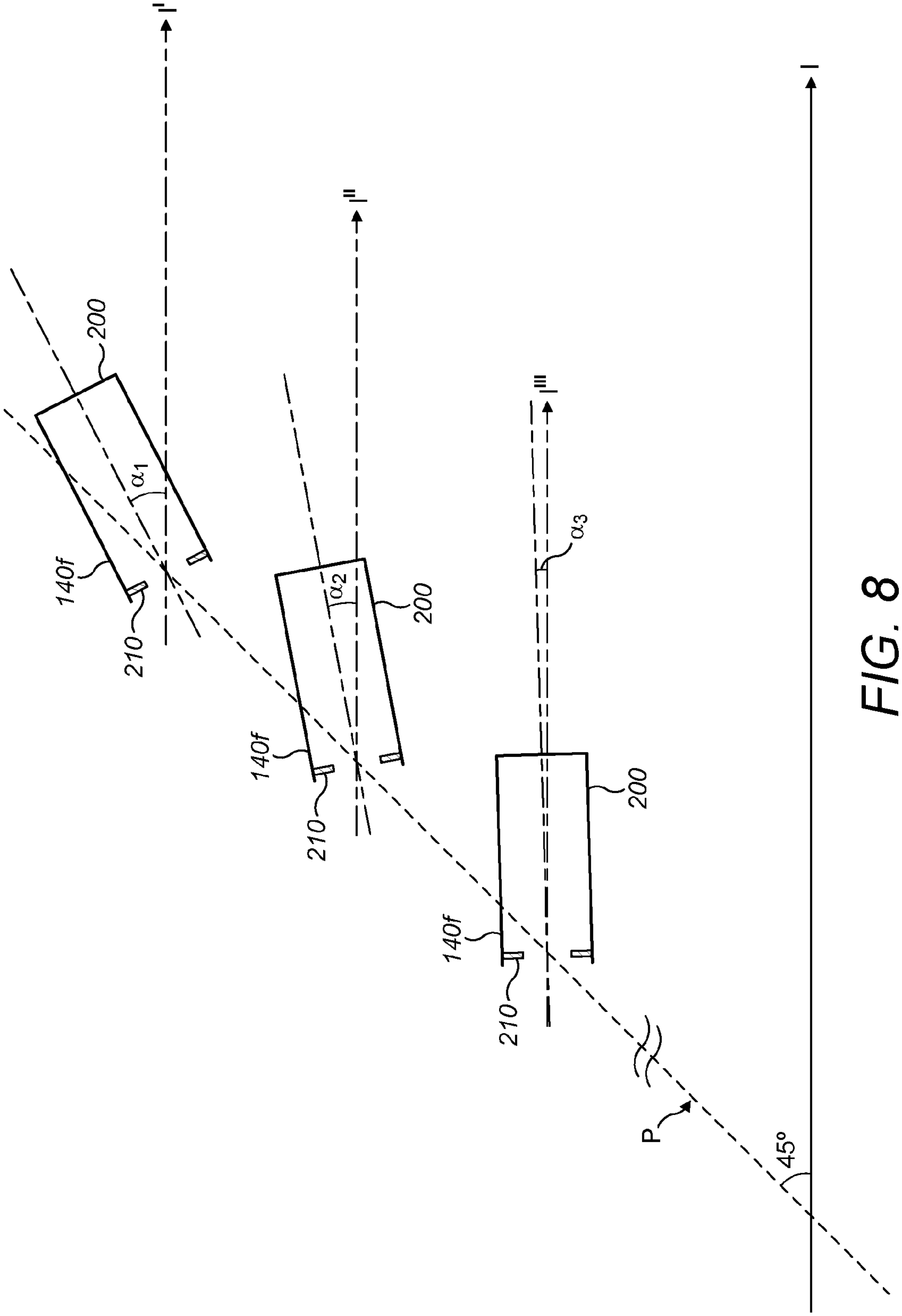
FIG. 8 shows a schematic plan view of one of the moveable collectors of FIG. 6, in multiple positions each of which is at a different angle relative to the central beam axis.

Referring first to FIG. 8, one of the plurality of Faraday detectors 140*f* is shown respectively in first, second and third positions relative to the fixed axial collector 120/the central ion beam axis I. As previously, no particular significance is to be attached to the selection of the Faraday detector 140*f* for the following description; the techniques employed are equally applicable to any of the plurality of moveable collectors 130*a*-130*h*. Moreover, FIG. 8 is not drawn to scale and the angles have been exaggerated to assist with explanation.

In a first position, wherein the Faraday detector 140*f* is furthest away from the central ion beam axis I in a direction along the focal plane P of the ion beam, the angle $\alpha$1 between the longitudinal axis of the Faraday detector relative to the central ion beam axis I is relatively large. In a second position, in which the Faraday detector 140*f* is relatively closer to the central ion beam axis I in a direction along the focal plane P of the ion beam, the angle $\alpha$2 between the longitudinal axis of the Faraday detector relative to the central ion beam axis I is smaller than the angle $\alpha$1. In a third position, the Faraday detector 140*f* is relatively closest to the central ion beam axis I in a direction along the focal plane P of the ion beam. Here, the angle $\alpha$3 between the longitudinal axis of the Faraday detector relative to the central ion beam axis I is smaller than the angle $\alpha$2.

As noted previously, ions arriving at the focal plane P are divergent (that is, the beam is somewhat fan shaped at the focal plane P). By allowing the angle $\alpha$ to be changed or adjusted as the Faraday detector 140*f* moves along the focal plane P of the ion beam 110 (not shown in FIG. 8), the relative angle between incident ions and the longitudinal axis of the Faraday detector 140*f* can be reduced or even substantially removed. This in turn permits the artefact 1 shown in FIG. 2 to be addressed/removed. No single compromise angle is chosen in the arrangement illustrated in FIG. 8, but rather a range of angles may be presented between the longitudinal axis of the Faraday detector relative to the central ion beam axis I. This in turn may allow a wider range of Faraday slit widths to be provided; in particular if the angle $\alpha$ between the longitudinal axis of the Faraday detector and to the central ion beam axis I can be adjusted as the Faraday detector moves along the focal plane P, it may be possible to employ a wider Faraday slit width than would otherwise be available if the artefact is to be removed. This in turn may permit a higher instrument sensitivity to be achieved.

Figure 9:
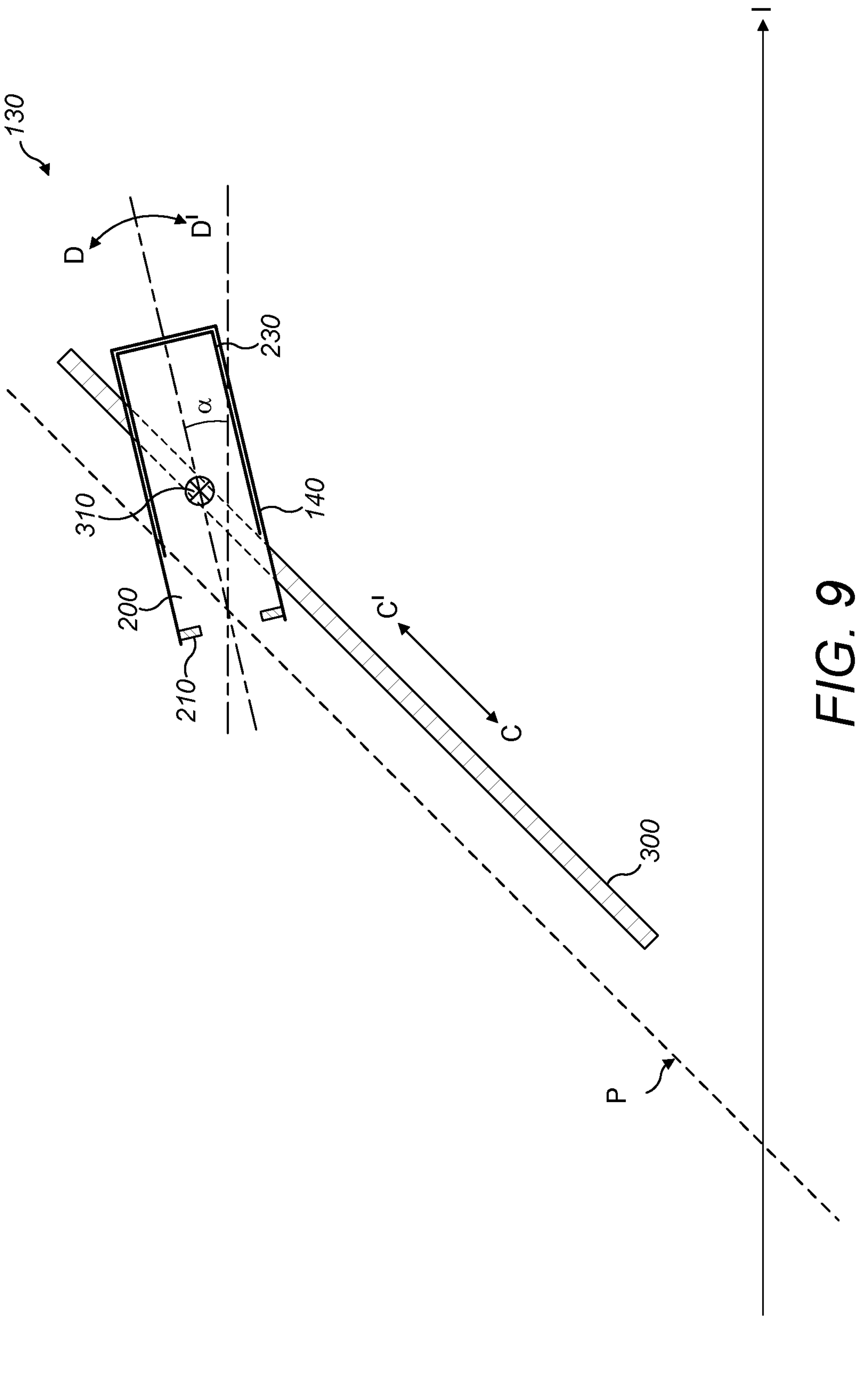
FIG. 9 shows a schematic plan view of one of the moveable collectors of FIG. 6, illustrating an embodiment of the present invention.

FIG. 9 illustrates, schematically, one possible mechanical arrangement of a moveable collector 130 that permits movement of the Faraday detector 140 both in a linear direction along the focal plane P of the ion beam, and also in a rotational direction about an axis defined through the Faraday detector 140. Again for clarity purposes, the CDD and other components forming the moveable collector 130 have been omitted.

As shown in FIG. 9, the moveable collector 130 is mounted upon a rail 300 that extends in a direction C-C' that is generally parallel with the focal plane P of the ion beam, that is, extends in preferred embodiments in a direction that is approximately 45 degrees to the central ion beam axis I. The moveable collector 130 is connected to the rail 300 via a pivotable connector 310 that permits rotation of the Faraday detector 140 in the direction D-D' marked in the Figure. In the embodiment of FIG. 9, the pivotable connector 310 is preferably connected between the rail 300 and a point on the moveable collector 130 at, or near, the latter's center of mass, for mechanical efficiency.

The moveable collector 130 may be connected to the computer 90 and may be driven by one or more motors that are under the control of the computer. The motor or motors may drive the moveable collector 130 linearly in the direction C-C' and also may rotate the Faraday detector in the direction D-D'. For example, a stepper motor could be employed under the control of the computer 90 so as to permit selection of one of a finite number of angles $\alpha$, depending upon the linear position of the moveable collector 130 upon the rail 300. The angle $\alpha$ might change linearly with position along the rail 300, or may change non-linearly, depending upon the specific profile of the ion beam in a direction transverse to the direction of beam travel. Still further, the angle $\alpha$ may be variable across a part of the extent of travel of the moveable collector 130 in the direction C-C', but fixed (eg, at a predetermined compromise angle) over a different part of that range of travel.

It will be understood that the arrangement in FIG. 9 could be employed in all or just some (as well as none) of the multiple moveable collectors. For example, it may be that moveable collectors 130 relatively closer to the fixed axial collector 120 are provided with a non-pivoting connector between the moveable collector 130 and the rail 300 upon which they move in the linear direction (C-C'). For those moveable collectors, a (single) compromise angle is then chosen for all linear positions of the moveable collector along the rail 300. Relatively outwardly positioned moveable collectors 130, however, could be provided with the pivotable connector 310 shown in FIG. 9. Such an arrangement may be appropriate where a compromise angle can be found that avoids the artefact 1 (FIG. 2) for an acceptably wide Faraday slit, for ions arriving at the focal plane relatively near to the central axis I of the ion beam, whereas for ions arriving at the focal plane P at relatively distant positions, a single compromise angle may not be suitable to avoid the artefact 1, without having to use an unacceptably narrow Faraday slit 210.

Figure 10:
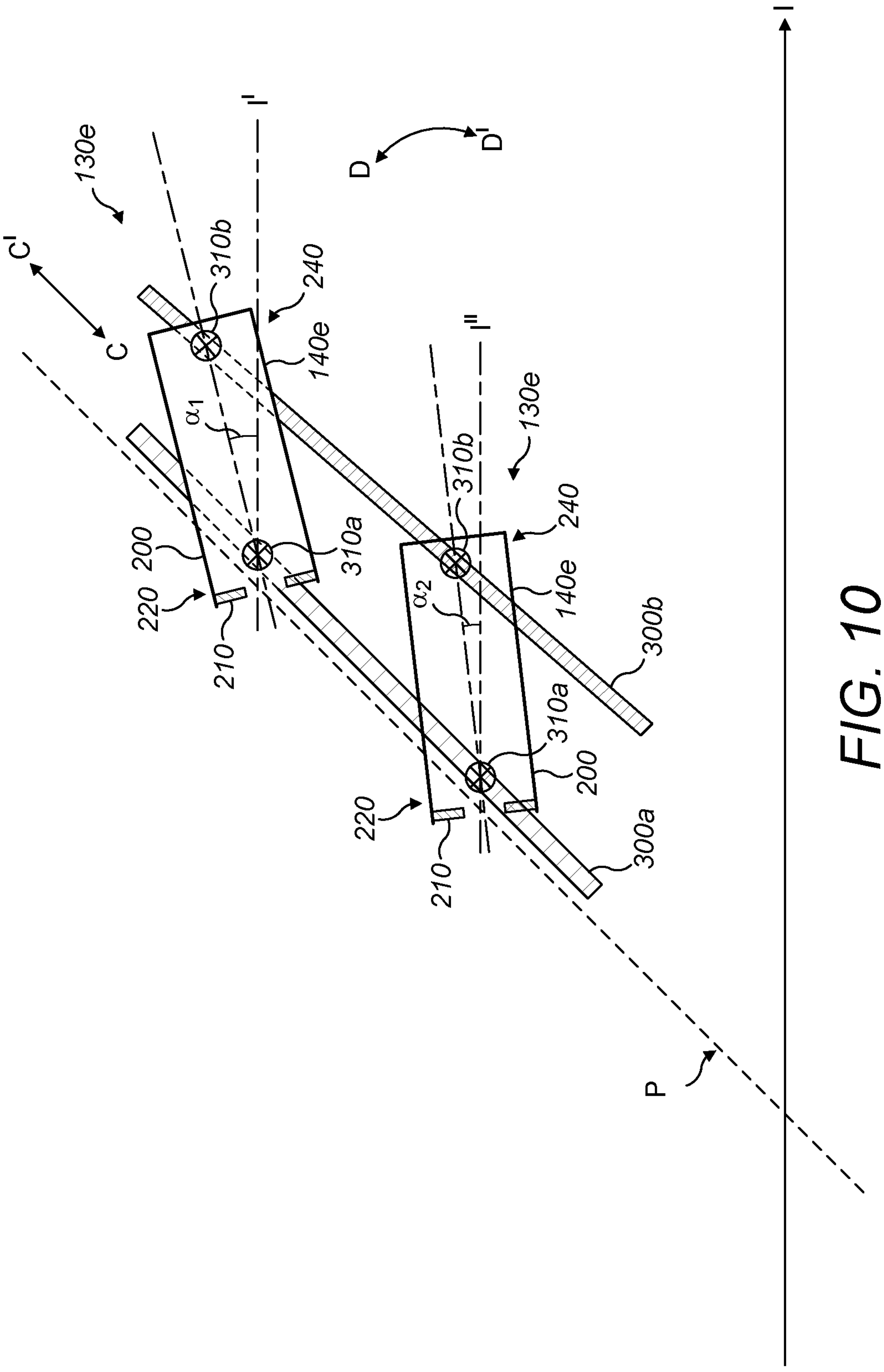
FIG. 10 shows a schematic plan view of one of the moveable collectors of FIG. 6, illustrating an alternative embodiment of the present invention.

FIG. 10 shows an alternative mechanical arrangement for linear and rotational movement of a moveable collector 130. In the arrangement of FIG. 10, components common to the arrangement of FIG. 9 are shown with like reference numerals.

In FIG. 10, a moveable collector 130*e* is illustrated, in highly schematic plan view (relative to the mass spectrometer 10 shown in FIG. 6), in first and second positions relative to the central ion beam axis I. Once again the choice of moveable detector 130*e* for exemplifying this embodiment of the invention is not to be considered to be significant.

In FIG. 10, by contrast with FIG. 9, the moveable collector 130*e* is mounted, at first and second ends thereof, upon a pair of non-parallel rails 300*a*, 300*b*. In particular, a first pivotable connector 300*a* is provided between the moveable collector 130*e* and a first rail 300*a* towards an opening end 220 of the Faraday detector 140*e*. A second pivotable connector 300*b* is provided between the moveable collector 130*e* and a second rail 300*b* towards a bottom end 220 of the cup 200 of the Faraday detector 140*e*. A motor or the like, for example under the control of the computer 90, may drive the moveable collector 130*e* along the first and second rails 300*a*, 300*b* in the direction C-C'. In FIG. 10, the first rail 300*a* extends in a direction that is generally parallel with the focal plane P, whereas the second rail 300*b* extends at an angle that is not parallel to that focal plane P. The changing separation between the two rails 300*a*, 300*b* in a direction parallel with the central ion beam axis I causes the moveable collector 130*e*, and hence the Faraday detector 140*e*, to rotate about an axis passing through the moveable collector 130*e* and defined in a direction into and out of the page (as viewed in FIG. 10).

In FIG. 10, the two rails 300*a*, 300*b* are each linear (though non parallel), so that the separation between the rails changes constantly with distance in the direction C-C'. Other arrangements can be contemplated; for example one or both of the rails may be curved; the two rails may be parallel along a part of their length and non-parallel (straight or curved) along another part of their length; or the rate of separation of the two rails 300*a*, 300*b* may be different at different parts of their lengths.

Figure 3:
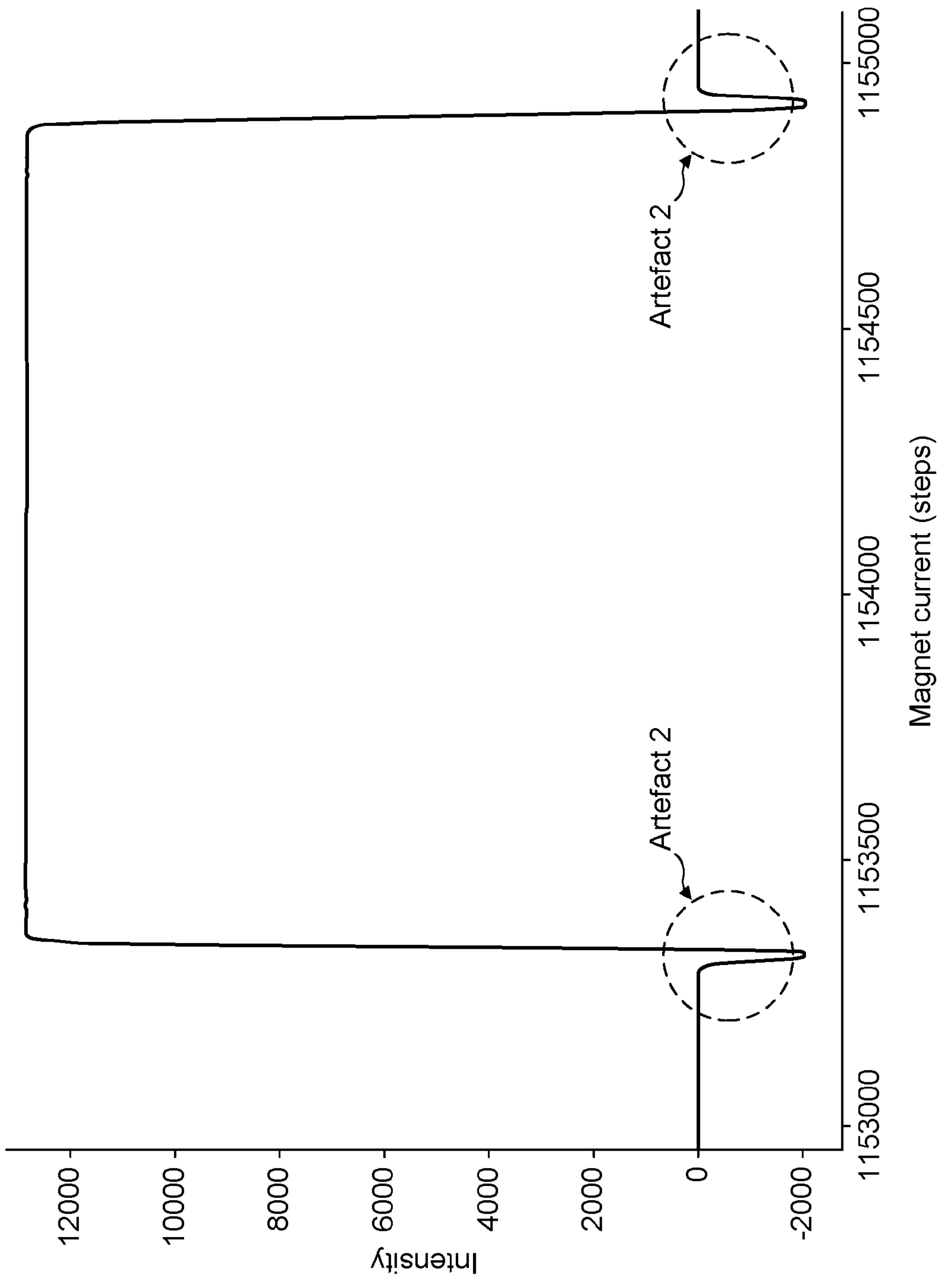
FIG. 3 shows a high resolution scan across a Faraday detector slit of an isotope ratio mass spectrometer having a second signal artefact.
Figure 11:
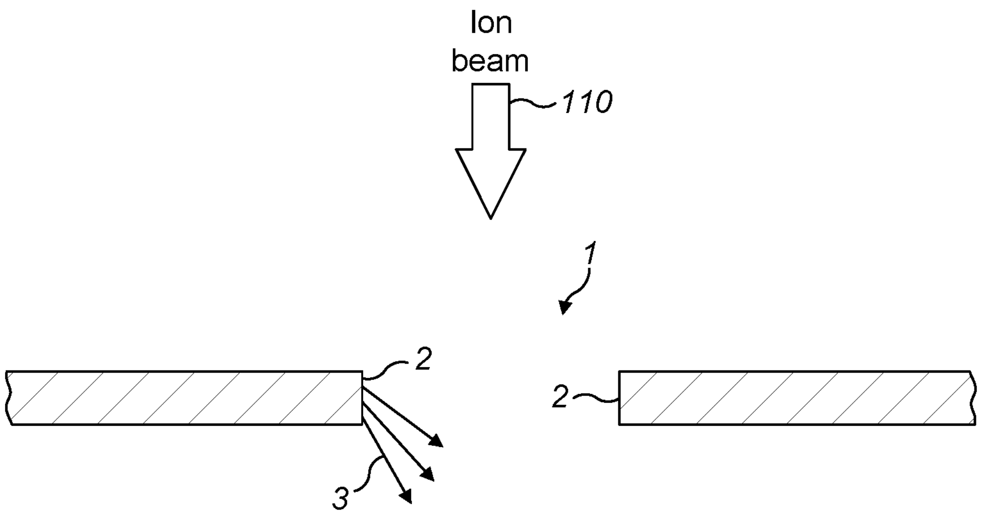
FIG. 11 (Prior Art)
FIG. 11 shows a schematic sectional view through the end of a Faraday detector, having Faraday slits configured in accordance with the prior art.

FIG. 11 shows a schematic sectional view through a prior art Faraday slit 1. The slit is laser cut and the side walls 2 of the slit 1 are generally parallel. The inventors have identified the artefact 2 shown in FIG. 3 (dips at the shoulders of the scan) and have posited that these dips are caused by the shape of the slit side walls. In particular, the inventors believe that the artefacts 2 are caused by ions incident upon the slit in FIG. 11 striking the inner side walls 2 of the slit 1, resulting in secondary electrons 3 that form an electron cloud at the edges of the slit 1 such that at least some of the electrons are collected by the Faraday detector. This electron cloud at the slit edges is what is believed to pull down the intensity vs. mass to charge ratio in the scan of FIG. 3.

Figure 12:
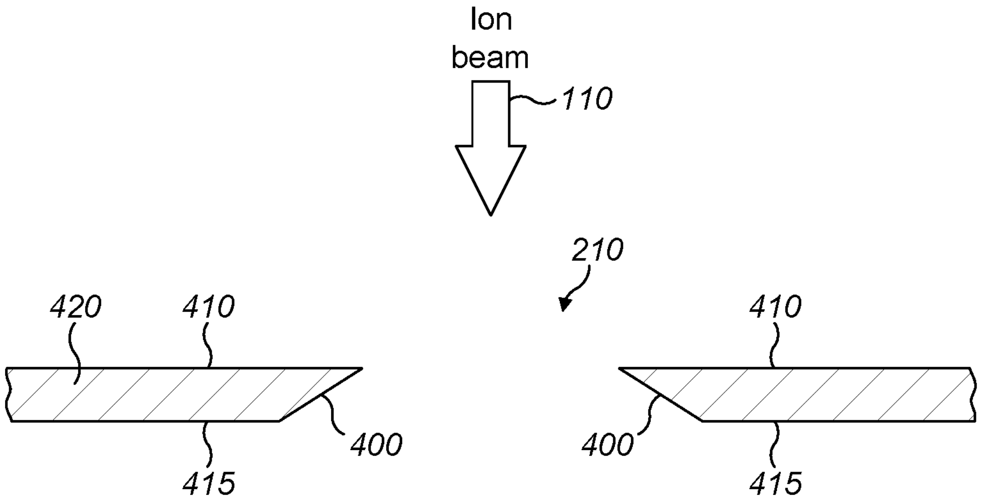
FIG. 12 shows a schematic sectional view through the end of a Faraday detector, having Faraday slits configured in accordance with a further embodiment of the invention.

FIG. 12 shows a schematic sectional view through a plate 420, in which is formed a Faraday slit 210 whose shape is in accordance with a further aspect of the present invention. As seen in FIG. 12, the side walls 400 of the slit entrance are formed with a slope so that the slit entrance at a front face 410 of the plate 420 is narrower than the slit opening at a rear face 415 of the plate 420. In that manner, ions arriving at the front face 410 of the plate 420, at a range of angles at and around 90 degrees to the front face 410 of the plate 420, cannot “see” the side walls 400 of the Faraday slit 210. This shape prevents the formation of secondary electrons as the incident ion beam strikes the inner side walls 400 of the Faraday slit 210.

The shaped Faraday slit 210 of FIG. 12 may be formed using a number of material processing techniques, such as laser cutting, grinding, polishing and so forth.

Although the side walls 400 shown in FIG. 12 have a constant slope between the front and rear faces 410, 415 of the plate 420, they do not need to be so. For example, the side wall could be curved—eg, convex—so that the rate of change of separation between the side walls 400 of the Faraday slit 210 increases in a direction from the front face 410 to the rear face 415 of the plate 420.

Although some specific embodiments have been described, it will be understood that these are merely for the purposes of illustration and that various modifications or alternatives may be contemplated by the skilled person.

The invention claimed is:

1. A method of configuring a Faraday detector in a mass spectrometer, wherein the mass spectrometer defines a central ion beam axis I, and further wherein the Faraday detector is moveable relative to the central ion beam axis I and includes a detector arrangement having a detector surface, and a Faraday slit defining an entrance for ions into the detector arrangement, the Faraday detector having an axis of elongation A which extends through the Faraday slit; the method comprising the steps of:

(a) selecting a width of the Faraday slit; and (b) adjusting an angle $\alpha$ of the Faraday detector, where $\alpha$ represents the angle between the axis of elongation, A, of the Faraday detector, and the central ion beam axis I so as to prevent admittance of incident ions into the detector cup of the Faraday detector, outside of a maximum admittance angle $\gamma$ defined between the axis of elongation A of the Faraday detector and a direction of incidence, B, of ions, at the Faraday detector, where $\alpha$ and/or $\gamma$ is selected according to the criterion that ions entering the detector arrangement should strike the detector surface at a location which prevents secondary electrons generated thereby from exiting the Faraday detector via the Faraday slit.

2. The method of claim 1, when the step (b) of adjusting the angle $\alpha$ of the Faraday detector is carried out iteratively.

3. The method of claim 1, wherein the Faraday detector is moveable within the mass spectrometer in a direction having at least a component in a direction across a beam of the incident ion, the method further comprising:

carrying out the step (b) at a plurality of different positions across the incident ion beam; and identifying a single compromise angle $\alpha$ between the axes A and I for each of the plurality of different positions across the incident ion beam, which results in a maximum admittance angle $\gamma$ based upon the said criterion.

4. The method of claim 1, wherein the Faraday detector is moveable within the mass spectrometer in a first, translational direction having at least a component in a direction across the incident ion beam, and in a second, rotational direction about an axis that permits change of the angle α, the method further comprising carrying out the step (b) of adjusting the angle α by rotating the Faraday detector in the second rotational direction as the Faraday detector is moved in the first translational direction.

5. The method of claim 4, wherein the Faraday detector orientation relative to the central ion beam axis is fixed so that the angle α remains constant, as the Faraday detector moves in the first translational direction, when the Faraday detector is located in a first range of positions along the first translational direction, and wherein the Faraday detector orientation relative to central ion beam axis I is varied by rotation in the second, rotational direction so that the angle α varies, as the Faraday detector moves in the first translational direction, when the Faraday detector is located in a second, different range of positions along the first translational direction.

6. The method of claim 4, further comprising:

controlling the movement of the Faraday detector in each of the first translational and second rotational directions so as to maintain the maximum admittance angle γ as the Faraday detector moves.

7. The method of claim 1, further comprising moving the Faraday detector within the focal plane of an incident ion beam.

8. The method of claim 1, wherein the Faraday detector is one of a plurality of Faraday detectors within a multiple collector of a mass spectrometer, each Faraday detector being spaced from one another in a direction perpendicular to the central ion beam axis I, the method further comprising separately carrying out the step (b) in respect of each of the plurality of moveable Faraday detectors, so as independently to identify a maximum admittance angle γ in respect of each such Faraday detector.

9. A multiple collector for a mass spectrometer, the multiple collector comprising a plurality of moveable collectors, at least some of which include a Faraday detector, the mass spectrometer defining a central ion beam axis I, and the Faraday detector having a Faraday slit, the multiple collector being under the control of a controller configured with a computer programme which, when executed, carries out the method of claim 1 so as to configure the Faraday detector.

10. A multiple collector for an isotope ratio mass spectrometer, the mass spectrometer defining a central ion beam axis upon which the multiple collector is positioned, the mass spectrometer being arranged to transport ions in an ion beam from an ion source towards the multiple collector; the multiple collector comprising:

at least one moveable collector including a Faraday detector, the Faraday detector defining a longitudinal axis A, a Faraday slit configured to face the incident ion beam, and through which the longitudinal axis A passes, and a detector arrangement for detecting ions that pass through the Faraday slit;

a guide upon which the moveable collector is arranged to move, the guide extending in a first translational direction which has a component orthogonal to the central ion beam axis I;

a rotational connector for connecting the moveable collector with the guide, the connector defining a rotational axis perpendicular to the first, translational direction; and a controller configured to control both movement of the moveable collector along the guide, and also the rotation of the moveable collector about the rotational connector, so as to constrain an admittance angle γ, defined as the angle between the direction of travel of ions in the ion beam that pass through the Faraday slit, and the longitudinal axis A of the Faraday detector, to be no greater than a predetermined maximum admittance angle $\gamma_{max}$ as the moveable collector moves to different positions along the guide.

11. The multiple collector of claim 10, comprising a plurality of moveable collectors, the movement of each of which is controlled by the controller so as, independently, to constrain the admittance angle γ to be no greater than a predetermined maximum admittance angle $\gamma_{max}$ for each of the plurality of moveable collectors.

12. The multiple collector of claim 11, wherein each of the plurality of moveable collectors is independently mounted upon a common guide.

13. A multiple collector for an isotope ratio mass spectrometer, the multiple collector comprising a plurality of collectors each of which includes a detector having a detector body containing a detector arrangement, and a detector front face having first and second opposed surfaces in a direction into the detector body, the detector front defining an entrance slit; characterized in that the entrance slit has an opening which is smaller on a first, front surface of the detector face, than on a second, opposed rear surface of the detector face.

14. The multiple collector of claim 13, wherein the dimensions of the opening increase at a substantially constant rate, between the first, front surface of the detector face, and the second, opposed rear surface of the detector face.

15. The multiple collector of claim 13, wherein the detector is a Faraday detector.

16. The multiple collector of claim 13, wherein the detector is a compact discrete dynode (CDD) dynode.

* * * * *